United States Patent
Ohnuma et al.

(10) Patent No.: US 7,179,726 B2
(45) Date of Patent: Feb. 20, 2007

(54) LASER PROCESSING APPARATUS AND LASER PROCESSING PROCESS

(75) Inventors: Hideto Ohnuma, Atsugi (JP); Nobuhiro Tanaka, Atsugi (JP); Hiroki Adachi, Atsugi (JP)

(73) Assignee: Semiconductor Energy Laboratory Co., Ltd., Kanagawa-ken (JP)

( * ) Notice: Subject to any disclaimer, the term of this patent is extended or adjusted under 35 U.S.C. 154(b) by 0 days.

(21) Appl. No.: 10/367,831

(22) Filed: Feb. 19, 2003

(65) Prior Publication Data

US 2003/0153167 A1   Aug. 14, 2003

Related U.S. Application Data

(62) Division of application No. 09/409,899, filed on Oct. 1, 1999, which is a division of application No. 09/275,078, filed on Mar. 24, 1999, now abandoned, which is a division of application No. 08/739,192, filed on Oct. 30, 1996, now Pat. No. 5,891,764, which is a division of application No. 08/511,466, filed on Aug. 4, 1995, now Pat. No. 5,643,801, which is a division of application No. 08/145,587, filed on Nov. 4, 1993, now abandoned.

(30) Foreign Application Priority Data

Nov. 6, 1992  (JP)  .................... 4-322737
Nov. 13, 1992 (JP)  .................... 4-328770

(51) Int. Cl.
*H01L 21/20* (2006.01)
(52) U.S. Cl. ...................... 438/487; 438/795
(58) Field of Classification Search ........... 438/166, 438/308, 798, 795, 149, 487, 479, 482, 483, 438/484, 485, 486
See application file for complete search history.

(56) References Cited

U.S. PATENT DOCUMENTS 3,848,104 A   11/1974   Locke (Continued)

FOREIGN PATENT DOCUMENTS

EP        334963         10/1989

(Continued)

OTHER PUBLICATIONS

Hashizume Tsutomu Patent Abstracts of Japan (Publication No. 04-011226) (Jan. 16, 1992).*

(Continued)

*Primary Examiner*—Brook Kebede
*Assistant Examiner*—Khiem Nguyen
(74) *Attorney, Agent, or Firm*—Eric J. Robinson; Robinson Intellectual Property Law Office, P. C.

(57) ABSTRACT

A laser processing process which comprises laser annealing a silicon film 2 μm or less in thickness by irradiating a laser beam 400 nm or less in wavelength and being operated in pulsed mode with a pulse width of 50 nsec or more, and preferably, 100 nsec or more.

A laser processing apparatus which comprises a laser generation device and a stage for mounting thereon a sample provided separately from said device, to thereby prevent transfer of vibration attributed to the movement of the stage to the laser generation device and the optical system. A stable laser beam can be obtained to thereby improve productivity.

78 Claims, 9 Drawing Sheets

U.S. PATENT DOCUMENTS

| | | | |
|---|---|---|---|
| 4,046,618 A | 9/1977 | Chaudhari et al. | |
| 4,059,461 A * | 11/1977 | Fan et al. | 438/92 |
| 4,083,272 A | 4/1978 | Miller | |
| 4,160,263 A | 7/1979 | Christy et al. | |
| 4,234,358 A | 11/1980 | Celler et al. | |
| 4,249,960 A | 2/1981 | Schnable et al. | |
| 4,309,225 A | 1/1982 | Fan et al. | |
| 4,328,553 A | 5/1982 | Frederickson et al. | |
| 4,341,569 A | 7/1982 | Yaron et al. | |
| 4,370,175 A | 1/1983 | Levetter | |
| 4,385,937 A | 5/1983 | Ohmura | |
| 4,439,245 A * | 3/1984 | Wu | 117/8 |
| 4,463,028 A | 7/1984 | Laude | |
| 4,468,551 A | 8/1984 | Neiheisel | |
| 4,469,551 A | 9/1984 | Laude | |
| 4,545,823 A | 10/1985 | Drowley | |
| 4,722,879 A | 2/1988 | Ueno et al. | |
| 4,724,466 A | 2/1988 | Ogawa et al. | |
| 4,727,044 A | 2/1988 | Yamazaki | |
| 4,734,550 A | 3/1988 | Imamura et al. | |
| 4,764,485 A | 8/1988 | Loughran et al. | |
| 4,803,528 A | 2/1989 | Pankove | |
| 4,805,000 A | 2/1989 | Ogawa et al. | |
| 4,835,704 A | 5/1989 | Eichelberger et al. | |
| 4,862,227 A | 8/1989 | Tsuge et al. | |
| 4,876,582 A * | 10/1989 | Janning | 257/66 |
| 4,885,260 A * | 12/1989 | Ban et al. | 117/92 |
| 4,937,618 A | 6/1990 | Ayata et al. | |
| 4,943,837 A | 7/1990 | Konishi et al. | |
| 4,956,539 A | 9/1990 | Uesugi et al. | |
| 4,970,366 A | 11/1990 | Imatou et al. | |
| 5,004,889 A | 4/1991 | Yamazaki et al. | |
| 5,122,223 A * | 6/1992 | Geis et al. | 117/44 |
| 5,141,885 A | 8/1992 | Yoshida et al. | |
| 5,145,808 A | 9/1992 | Sameshima et al. | |
| 5,217,921 A | 6/1993 | Kaido et al. | |
| 5,219,786 A | 6/1993 | Noguchi et al. | |
| 5,221,365 A | 6/1993 | Noguchi et al. | |
| 5,231,297 A * | 7/1993 | Nakayama et al. | 257/77 |
| 5,241,211 A | 8/1993 | Tashiro | |
| 5,252,502 A | 10/1993 | Havemann | |
| 5,264,072 A | 11/1993 | Mukai | |
| 5,272,355 A * | 12/1993 | Namavar et al. | 257/3 |
| 5,288,684 A * | 2/1994 | Yamazaki et al. | 118/722 |
| 5,289,030 A | 2/1994 | Yamazaki et al. | |
| 5,304,357 A | 4/1994 | Sato et al. | |
| 5,308,998 A * | 5/1994 | Yamazaki et al. | 257/57 |
| 5,313,076 A | 5/1994 | Yamazaki et al. | |
| 5,348,897 A | 9/1994 | Yen | |
| 5,348,903 A | 9/1994 | Pfiester et al. | |
| 5,352,291 A | 10/1994 | Zhang et al. | |
| 5,365,875 A * | 11/1994 | Asai et al. | 438/487 |
| 5,372,089 A | 12/1994 | Yoshida et al. | |
| 5,372,836 A | 12/1994 | Imahashi et al. | |
| 5,413,958 A | 5/1995 | Imahashi et al. | |
| 5,424,244 A * | 6/1995 | Zhang et al. | 438/301 |
| 5,455,430 A * | 10/1995 | Noguchi et al. | 257/53 |
| 5,477,073 A | 12/1995 | Wakai et al. | |
| 5,533,040 A | 7/1996 | Zhang | |
| 5,545,571 A | 8/1996 | Yamazaki et al. | |
| 5,561,081 A | 10/1996 | Takemuchi et al. | |
| 5,578,520 A | 11/1996 | Zhang et al. | |
| 5,612,251 A | 3/1997 | Lee | |
| 5,622,814 A | 4/1997 | Miyata et al. | |
| 5,643,801 A | 7/1997 | Ishihara et al. | |
| 5,648,277 A | 7/1997 | Zhang et al. | |
| 5,696,003 A | 12/1997 | Makita et al. | |
| 5,712,191 A | 1/1998 | Nakajima et al. | |
| 5,756,364 A | 5/1998 | Tanaka et al. | |
| 5,849,043 A | 12/1998 | Zhang et al. | |
| 5,858,473 A | 1/1999 | Yamazaki et al. | |
| 5,891,764 A | 4/1999 | Ishihara et al. | |
| 5,897,799 A | 4/1999 | Yamazaki et al. | |
| 5,962,897 A | 10/1999 | Takemura et al. | |
| 5,968,383 A | 10/1999 | Yamazaki et al. | |
| 5,977,559 A | 11/1999 | Zhang et al. | |
| 6,002,101 A | 12/1999 | Yamazaki et al. | |
| 6,031,290 A | 2/2000 | Miyazaki et al. | |
| 6,080,643 A * | 6/2000 | Noguchi et al. | 438/487 |
| 6,087,277 A | 7/2000 | Shih et al. | |
| 6,204,099 B1 | 3/2001 | Kusumoto et al. | |
| 6,358,784 B1 | 3/2002 | Zhang et al. | |
| 6,586,346 B1 * | 7/2003 | Yamazaki et al. | 438/774 |
| 6,784,530 B2 * | 8/2004 | Sugaya et al. | 257/686 |

FOREIGN PATENT DOCUMENTS

| | | |
|---|---|---|
| JP | 52-136497 | 11/1977 |
| JP | 55-067132 | 5/1980 |
| JP | 56-059694 | 5/1981 |
| JP | 57-094482 | 6/1982 |
| JP | 57-187933 | 11/1982 |
| JP | 57-193291 | 11/1982 |
| JP | 58-037918 | 3/1983 |
| JP | 58-092213 | 6/1983 |
| JP | 58-127318 | 7/1983 |
| JP | 60-154549 | 8/1985 |
| JP | 60-202931 | 10/1985 |
| JP | 60-245124 | 12/1985 |
| JP | 61-048979 | 3/1986 |
| JP | 61-145819 | 7/1986 |
| JP | 61-234027 | 10/1986 |
| JP | 62-165916 | 7/1987 |
| JP | 62-216320 | 9/1987 |
| JP | 63-018621 | 1/1988 |
| JP | 63-080987 | 4/1988 |
| JP | 63-133522 | 6/1988 |
| JP | 64-028916 | 1/1989 |
| JP | 01-076715 | 3/1989 |
| JP | 64-071587 | 3/1989 |
| JP | 01-212431 | 8/1989 |
| JP | 01-241862 | 9/1989 |
| JP | 02-006091 | 1/1990 |
| JP | 02-027768 | 1/1990 |
| JP | 02-117788 | 5/1990 |
| JP | 02-147182 | 6/1990 |
| JP | 02-177422 | 7/1990 |
| JP | 02-181419 | 7/1990 |
| JP | 02-199813 | 8/1990 |
| JP | 02-228043 | 9/1990 |
| JP | 02-277244 | 11/1990 |
| JP | 02-283016 | 11/1990 |
| JP | 03-034434 | 2/1991 |
| JP | 03-062971 | 3/1991 |
| JP | 03-159119 | 7/1991 |
| JP | 03-255444 | 11/1991 |
| JP | 03-286518 | 12/1991 |
| JP | 04-049680 | 2/1992 |
| JP | 04-069870 | 3/1992 |
| JP | 04-120738 | 4/1992 |
| JP | 04-206836 | 7/1992 |
| JP | 04-299534 | 10/1992 |
| JP | 04-338631 | 11/1992 |
| JP | 05-190451 | 7/1993 |
| JP | 05-235031 | 9/1993 |
| JP | 06-295859 | 10/1994 |
| JP | 02-222154 | 9/1999 |

OTHER PUBLICATIONS

R. Z. Bachrach et al., *Low Temperature Crystallization of Amorphous Silicon Using an Excimer Laser*, Journal of Electronic Materials, vol. 19, No. 3, Jan. 1, 1990, pp. 241-248.

Specification and Drawings for U.S. Appl. No. 09/779,826, "A Semiconductor Device and a Manufacturing Method Thereof," Inventors Hongyong Zhang et al, Aug. 16, 2001.

Specification and Drawings for U.S. Appl. No. 09/409,662, "Method of Fabricating a MIS Transistor," Sep. 30, 1999, Inventors Shunpei Yamazaki et al.

Makino, "Application of Polyimide Resin to Semiconductor Devices in Japan," Mar./Apr. 1988, pp. 15-23, IEEE Electrical Insulation Magazine, vol. 4, No. 2.

"Laser Annealing of Semiconductors," Edited by Poate, Article by Foti et al., Epitaxy by Pulsed Annealing of Ion-Implanted Silicon, Foti et al., (1982) Academic Press, pp. 203-245.

Young et al., "Effect of Pulse Duration on the Annealing of Ion Implanted Silicon With a XeCl Excimer Laser and Solar Cells," in Laser-Solid Interactions and Transient Thermal Procesing of Materials, 1983, pp. 401-406.

Biegelsen et al., "Laser-Induced Crystallization of Silicon on Bulk Amorphous Substrates: An Overview" in Laser-Solid Interactions and Transient Thermal Processing of Materials, 1983, pp. 537-548.

Inoue et al., "Low Temperature CMOS Self-Aligned Poly-Si TFTs and Circuit Scheme Utilizing New Ion Doping And Masking Technique," IEDM 1991, pp. 555-558, Dec. 8-11, 1991.

Kyriyama et al., "High Mobility Poly-Si TFT by a New Excimer Laser Annealing Method for Large Area Electronics," 1991, 563-566, IEEE.

Wolf, "Silicon Processing for the VLSI Era," vol. 2, 1990, pp. 66-67.

Devor, "Nd:Yag Quantum, Efficiency and Related Radiative Properties," 1989, pp. 1863-1873, IEEE.

* cited by examiner

LASER PROCESSING APPARATUS AND LASER PROCESSING PROCESS

BACKGROUND OF THE INVENTION

1. Field of the Invention

The present invention relates to a laser processing apparatus improved in reliability and suited for mass production. The present invention also relates to a reliable laser annealing process suited for mass production, which yet yields low fluctuation and high production yield. In particular, the present invention relates to an annealing process for silicon films, and to a step for crystallizing an amorphous film or a film in a nearly amorphous state, as well as to a step for activating silicon films which were considerably damaged in crystallinity due to ion irradiation, ion implantation, ion doping, etc.

2. Prior Art

Recently, studies on lowering the process temperature for fabricating semiconductor devices and on increasing the area of the devices are extensively performed. In particular, much attention is being paid to laser processing techniques such as laser scribing (cutting thin film samples and the like by irradiating a high energy laser beam to the thin film), laser annealing (irradiating a high energy laser beam to the surface of the sample to effect surface crystallization and the like on the sample), and laser doping (diffusing impurities and the like by irradiating a high energy laser beam to the surface of the sample), as ultimate low temperature processes for treating large area devices.

Researchers of laboratory scale have been conducted to present, however, many problems concerning the application of laser processing technology to mass production have been left out of consideration. For instance, no technology for reducing malfunction and minute displacement of the sample during the laser beam irradiation nor technology for easily irradiating the laser beam to the desired portion has been developed to present.

In particular, large area processes can be effected more efficiently by irradiating laser beams in stripes while moving the sample along one direction. Since the sample movement is confined in a single direction, the movement of the sample can be more easily and simply controlled as compared with a process in which a spot laser beam is scanned over the sample. To make the process more suited for mass production, however, the sample must be moved on a stage driven by a step motor or a servomotor. This inevitably vibrates the sample, and the stage vibration is transferred to the laser apparatus. Accordingly, the vibration of the laser apparatus causes the laser output to fluctuate. However, no drastic solution for such a problem has been proposed to present. Moreover, no profound consideration has been given to the method of sample alignment in using stripe-emitting lasers.

Furthermore, no sufficient study on the conditions for laser annealing has been made so far. Thorough study on such conditions has been neglected under the excuse of greatly varying conditions which depend on the individual apparatuses and the deposited films. Accordingly, it has been generally believed that a laser annealing technology is of no practical use due to the lack of reproducibility and stability.

SUMMARY OF THE INVENTION

An object of the present invention is to provide a laser annealing process furnished with novel conditions, so that it may yield reproducible results.

Another object of the present invention is to provide a laser processing apparatus having a particular structure which prevents the vibration of the stage from being transferred to the laser apparatus.

A still another object of the present invention is to provide an optimal method for sample alignment.

The present inventors have studied optimal conditions for laser annealing thin films having initially such a low crystallinity as to make its application as a semiconductor impossible, or thin films of reduced crystallinity due to processes such as ion irradiation, ion implantation, and ion doping, to thereby crystallize and activate them and to impart them properties so that they may function sufficiently as semiconductors. As a result, it has been found that the optimal conditions vary not only by the energy of the laser radiation but also by the pulse width and the wavelength thereof.

The present invention comprises activating a thin film 2 μm or less in thickness and containing silicon as the main constituent by laser annealing, and the process comprises, by taking the light transmittance of the film into consideration, irradiating a short wavelength laser beam 400 nm or less in wavelength.

DETAILED DESCRIPTION OF THE INVENTION

In general, it is believed that a film can be sufficiently activated by irradiating a laser beam of high energy density and that the sheet resistance thereof can be thereby lowered. In practice, however, no reproducible results can be obtained by a process of irradiating a high energy density laser beam due to the laser absorption properties of the film and to the instable laser output.

Under such circumstances, the present inventors have found that the width of a laser pulse plays an important role in optimizing the laser annealing conditions. More specifically, it has been found that a laser irradiated at a pulse width of 50 nsec or less yield a particularly low reproducibility. This result could not be explained even taking the fluctuation of about 5% in laser energy into consideration. This fact still awaits for a complete explanation, however, based on detailed study, the present inventors have concluded to present that defects form randomly during progressive crystallization of the film subjected to the instantaneous irradiation of a high energy laser beam. It has been suggested that such defects form randomly, and that the formed defects serve as sources for forming further defects therefrom. An experimentation was performed to confirm this hypothesis by varying the pulse width of the laser beam, and as a result, it has been found that a considerably favorable result can be obtained by irradiating the laser beam at a pulse width of 50 nsec or more, and preferably, at 100 nsec or more.

It has been found also that a favorable result on laser annealing can be obtained by not using a film exposed in air but using a film covered with a light-transmitting film 10 to 100 nm in thickness or a film placed under reduced pressure.

Furthermore, it has been found that the effect of laser annealing is subject to the type of impurities incorporated in the film. This can be explained by the fact that the impurities differ in absorption coefficient for a laser light. More specifically, impurities such as phosphorus, boron, and arsenic are suited for the above light 400 nm or less in wavelength. It should be noted, however, that this does not exclude other impurities.

The laser light may be irradiated from the front side or from the back side of the substrate. When a laser beam is irradiated from the back side, however, the substrate material must allow transmission of a laser light.

Figure 1:
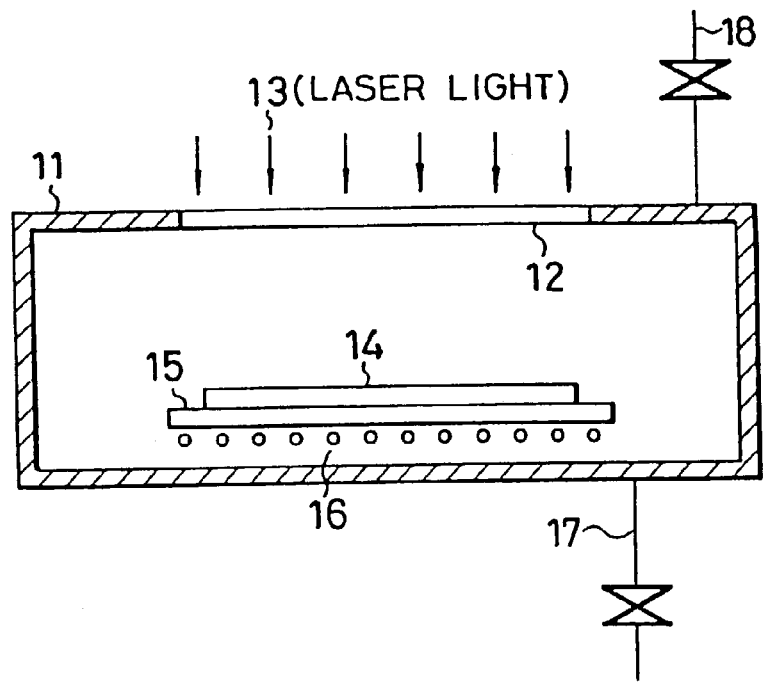
FIG. 1 shows schematically a laser annealing apparatus for implementing a process for laser processing according to the present invention.

Referring to FIG. 1, an apparatus for conducting the process according to the present invention and the operation method thereof are described below. FIG. 1 shows a schematic view, and a practical apparatus may be equipped with other components depending on the requirements. The mode of operating the apparatus is described below.

Referring to FIG. 1, the apparatus comprises a sample holder 15 to mount thereon a sample 14. First, a chamber 11 is evacuated to vacuum using an evacuation system 17 connected to an evacuation apparatus. A vacuum degree as high as possible is preferably achieved in this evacuation step, because air components such as carbon, nitrogen, and oxygen are generally not preferred for a semiconductor. These elements are incorporated into the semiconductor to lose the activity of the impurity dopants incorporated intentionally into the semiconductor. Such elements also impair the crystallinity of the semiconductor and cause dangling bonds to form at the grain boundaries. Accordingly, it is preferred that the chamber is evacuated to a vacuum degree of $10^{-6}$ torr or lower, and more preferably, to a vacuum degree of $10^{-8}$ torr or lower.

It is also preferred that a heater 16 is operated just before or after the evacuation to drive out the atmospheric components having adsorbed inside the chamber. Further preferred is to provide a preliminary chamber in addition to the vacuum chamber as in the vacuum apparatuses actually used, so that the vacuum chamber may not be brought into direct contact with the atmosphere. As a matter of course, a turbo molecular pump or a cryo pump is preferred to a rotary pump or an oil diffusion pump, because the former ones are less feared of carbon contamination and the like.

Then, a laser beam 13 is irradiated to the sample through a window 12. At this moment, the sample is heated by a heater to maintain a constant temperature. The laser beam is irradiated in pulses from 5 to 50 pulses per point. Since the energy of laser pulses greatly fluctuates, defects may form with greater probability at points irradiated with fewer pulses. On the other hand, irradiation of too many pulses per point is not preferred from the viewpoint of mass production (throughput). Accordingly, the present inventors have found that the laser beam is preferably irradiated in pulses to a point at repetition times within the defined range above from the viewpoint of making the process suited for mass production and of product yield.

Figure 2:
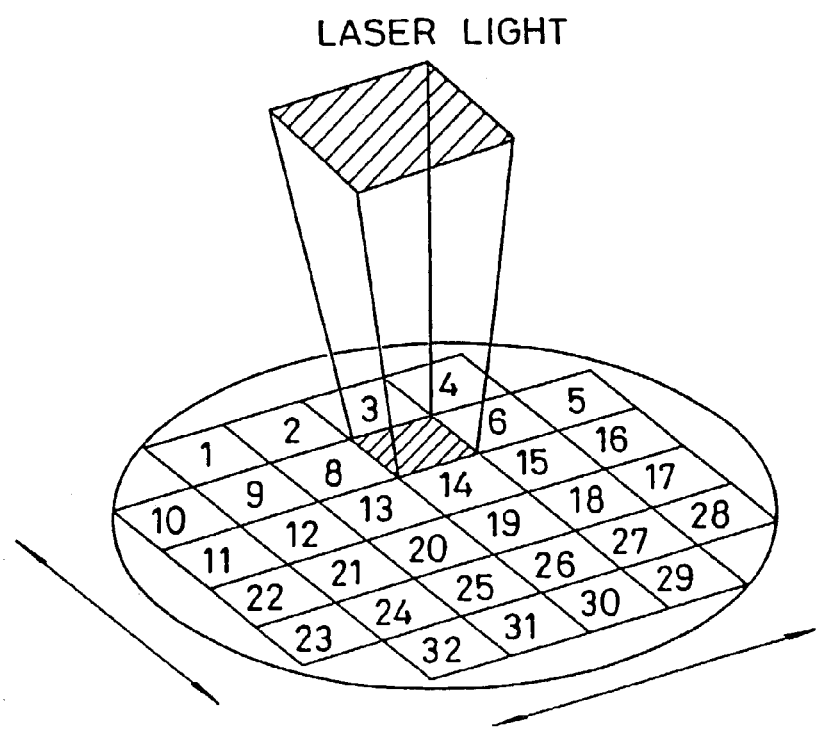
FIG. 2 shows a step for laser processing according to the present invention.

On irradiating a laser beam having a cross section of a specified shape, e.g., a rectangle 10 mm in width along the x-direction and 30 mm in length along the y-direction, the pulsed beam may be irradiated for a repetition of 10 times on a same particular area and then moved to the neighboring area upon completion of the irradiation. Otherwise, the laser beam may be advanced 1 mm along the x direction per pulse. Furthermore, the cross section of the laser beam may be a rectangle as shown in FIG. 2, and the laser beam may be moved over the substrate along the four directions, i.e., it may be moved up and down and right and left.

Subsequent to the completion of laser irradiation, the chamber is evacuated to vacuum, and the chamber is cooled to room temperature to take the sample out of the chamber. It can be seen from the foregoing that the doping process according to the present invention can be conducted simply and rapidly.

The laser processing apparatus according to the present invention comprises, apart from a stage for mounting thereon a sample, a laser generation device and a laser optical system installed on an apparatus having a vibration isolation structure (such as a vibration proof table and an optical frame). Furthermore, the stage and the drive mechanism therefor are installed on a vibration isolation device different from the one above or directly on the floor.

As a result of the configuration above, the apparatus above prevents vibration attributed to the movement of the stage from being transferred to the laser optical system and the laser generation apparatus. Accordingly, no fluctuation of laser output attributed to the displacement of the optical axis occurs in the apparatus according to the present invention. The laser optical system and the laser generation device may be installed on the same vibration isolation device or each separately on vibration isolation devices independent to each other.

Figure 8:
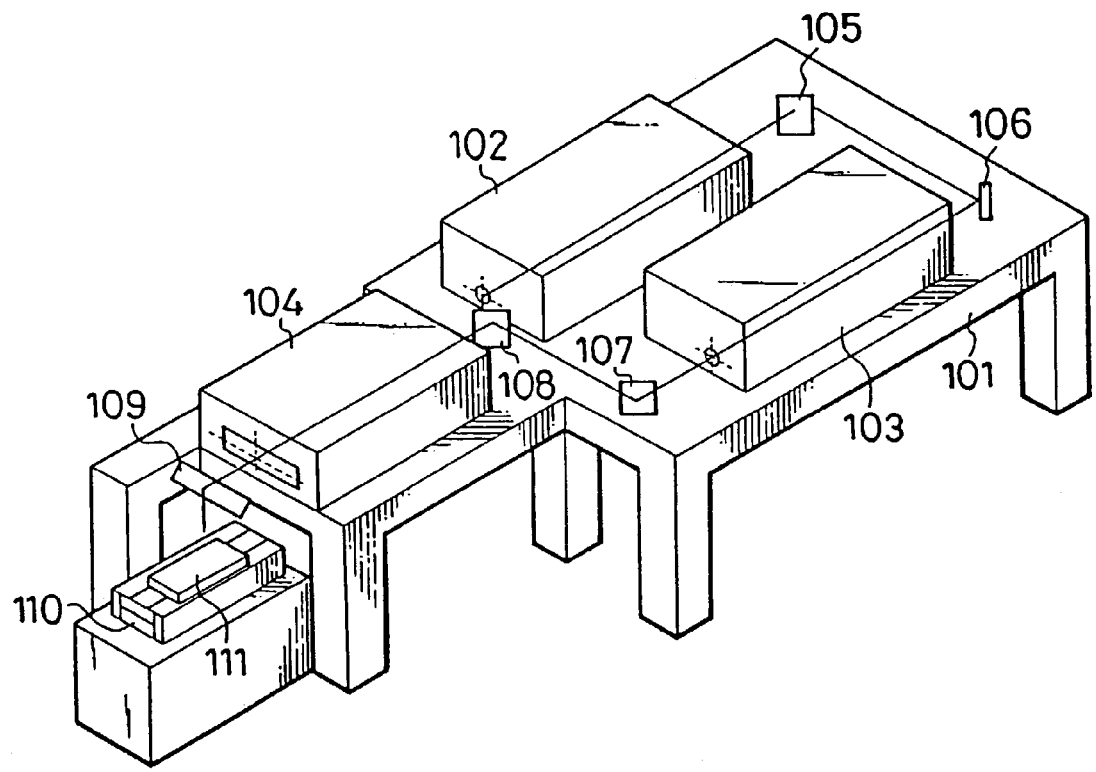
FIG. 8 shows schematically a laser processing apparatus according to the present invention.

A typical laser processing apparatus according to the present invention is shown schematically in FIG. 8. Referring to FIG. 8, a laser generation device 102, a laser amplification device 103, and a laser optical system 104 are installed on a vibration isolation table 101, and mirrors 105 to 108 are provided in the optical paths. In the laser optical system, a laser beam having an approximately square cross section and a Gaussian distribution is processed to produce a highly uniform stripe shaped output laser beam. The thus emitted laser beam is irradiated to the sample via a rectangular mirror 109.

The laser processing apparatus above comprises the laser generation device, the laser amplification device, and the optical system on the same vibration isolation table 101. Apart from those, a sample 111 is mounted on a stage (X-Y-θ) 110, and they as a whole are placed on a table separately from the above vibration isolation table. The stage is driven by the X- and Y-axes using a DC servomotor, and using a stepping motor (pulse motor) for the θ-axis direction.

The technology for sample alignment is important. On using a laser beam in stripes, many factors of misalignment cast serious problems. In particular, these factors leading to misalignment cannot be neglected in the fabrication of integrated circuits, because it requires the laser beam to be introduced strictly in parallel with the sample pattern.

In some cases, for instance, the sample patterns are formed slightly rotated with respect to the substrate. In other cases, the plane subjected to the incident laser beam may be slightly displaced from the direction of moving the sample (stage). Furthermore, the camera for monitoring the alignment of the sample may be installed not in parallel with the plane subjected to the incident laser beam.

The displacement of the above factors leading to misalignment, except the first one, is fixed and can be evaluated in advance. Accordingly, these can be adjusted at the alignment step. Thus, the process according to the present invention comprises initially positioning the sample using a monitoring camera, and then performing predetermined correction to achieve the required parallel between the sample and the laser beam. The correction is performed by rotating the sample stage. More specifically, the process according to the present invention requires the sample to be moved not only translation along a single direction, but also by rotation.

The present invention is illustrated in greater detail referring to non-limiting examples below. It should be understood, however, that the present invention is not to be construed as being limited thereto.

EXAMPLE 1

Figure 3:
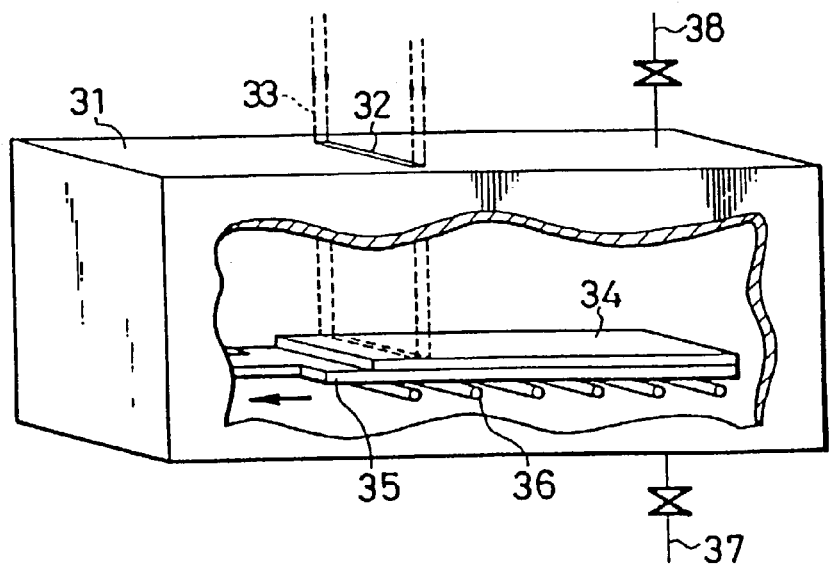
FIG. 3 shows an embodiment of an apparatus according to the present invention.

Referring to FIG. 3, an apparatus for doping process according to the present invention is described below. The apparatus comprises a chamber 31 equipped with a slit-shaped window 32 made of anhydrous quartz glass. A laser beam is irradiated through this window and shaped to have a slit-like cross section, e.g., a rectangular shape 10 mm×300 mm in area. The position of the laser beam is fixed. The chamber also comprises an evacuation system 37, a gas system 38 for introducing a passivation gas. A sample 34 is mounted on a sample holder 35 placed inside the chamber, and is heated by an infrared lamp 36 which functions as a heater provided under the sample holder. The sample holder is movable, and is moved in accordance with the laser shots.

When a mechanism for moving the sample is assembled inside the chamber as in this example, misalignment occurs due to the thermal expansion of the sample holder being heated by the heater. Thus, strict control of the temperature is required during the process. Furthermore, the maintenance inside the chamber is rather complicated, because the sample transport mechanism is a source of dust.

EXAMPLE 2

Figure 4A:
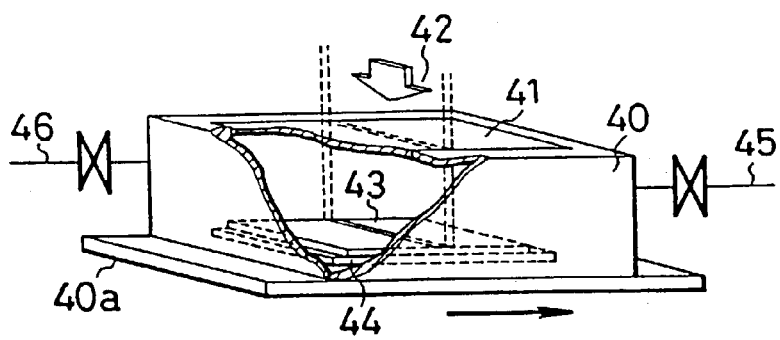
FIGS. 4(A) and 4(B) show another embodiment of an apparatus according to the present invention.

Referring to FIG. 4(A), an apparatus for doping process according to the present invention is described below. The apparatus comprises a chamber 40 provided with a window 41 made of anhydrous quartz glass. This window covers the entire area of a sample 43, and it differs in this point from that of the apparatus described in Example 1. An evacuation system 45 and a gas system 46 for introducing the passivation gas are also connected to the chamber. A sample 43 is mounted on a sample holder 44 fixed inside the chamber, and the sample holder is equipped with a built-in heater. A table 40a is provided to the lower part of the chamber so that the entire chamber may be moved in accordance with the laser beam emitted in pulses. A laser beam having a rectangular cross section, e.g., 5 mm×100 mm in area, similar to that used in Example 1 is employed. The position of the laser beam is fixed as in Example 1, but a mechanism for moving the entire chamber is employed in this case. Accordingly, differing from the case in Example 1, the maintenance of the entire chamber is facilitated in this embodiment because any mechanical portion which may generate dust, etc., is excluded from the inside of the chamber. Furthermore, the transportation mechanism need not be subjected to the heat generated from the heater.

Figure 4B:
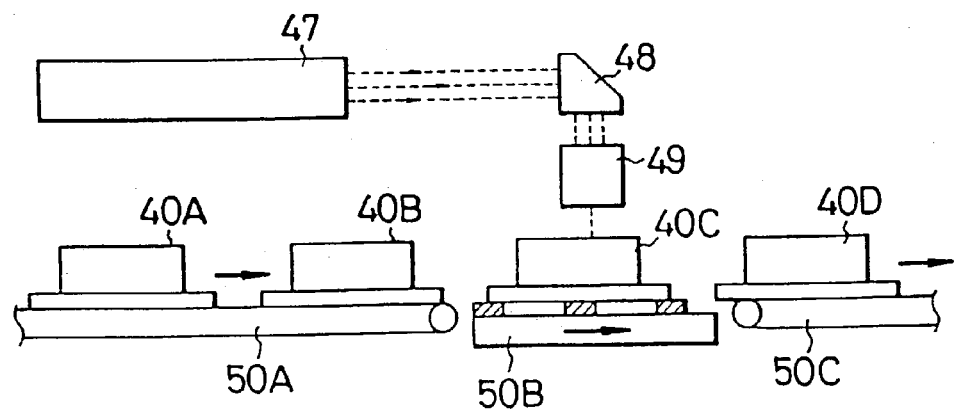

The present embodiment not only is superior to the one of Example 1 in the above points, but also in the following points. The embodiment of Example 1 requires some time before irradiating the laser beam waiting for the chamber to be evacuated to achieve a sufficiently high vacuum degree; i.e., considerably long dead time must be incorporated in the process of Example 1. In contrast, dead time can be completely eliminated from the process of the present example by providing a plurality of chambers as shown in FIG. 4(A), and sequentially subjecting the chambers to the steps of charging a sample, evacuating the chamber to vacuum, irradiating laser to the sample, and taking the sample out of the chamber. The entire system is illustrated in FIG. 4(B).

In further detail, chambers 40A and 40B each provided with an untreated sample are transferred during the evacuation step using a continuous transportation mechanism to a frame 50B equipped with a stage which allows the sample to be moved with high precision. A laser beam is generated in a laser apparatus 47 and processed in suitable optical devices 48 and 49, so that it may be irradiated through a window to a sample placed inside a chamber 40C mounted on the stage. After subjecting the sample inside the chamber 40C to sufficient laser irradiation by moving the chamber, the chamber 40C is transferred to the next step using again a continuous transport mechanism 50C. During this transportation step, the heater is turned off and the chamber is evacuated, so that the sample may be dismounted after a sufficiently low temperature is achieved.

It can be seen that the present embodiment allows the process to advance in continuous steps. Accordingly, the waiting time for the evacuation of the chamber can be cut off, and thereby the throughput can be increased. As a matter of course, it should be taken into consideration that the embodiment referred in the present Example provides a higher throughput at the expense of involving more chambers as compared with the embodiment referred to in Example 1. Thus, in the practical implementation of the process, the scale of mass production and the quantity of investment must be taken into consideration.

EXAMPLE 3

Figure 5A:
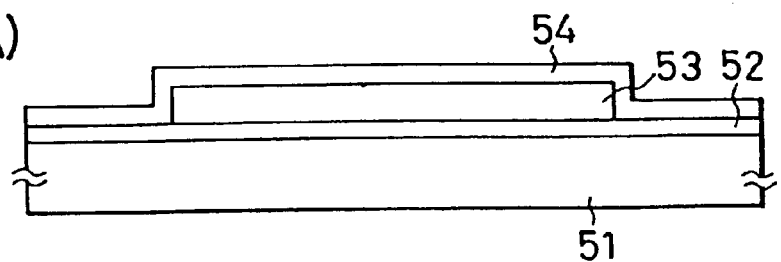
FIGS. 5(A) to 5(C) show a step-sequential process for fabricating a TFT according to the present invention.

Referring to FIG. 5, an example of applying a doping process according to an embodiment of the present, invention to the fabrication of an NTFT on a glass substrate is described below. In the present example, a glass substrate or a quartz substrate was used. An $SiO_2$ film was deposited on a glass substrate 51 as a base protective film 52, and a substantially intrinsic hydrogenated amorphous silicon semiconductor layer 53 was deposited thereon at a thickness of 100 nm using plasma CVD. Then, patterning for the isolation of devices was performed. The sample was heated in vacuum ($10^{-6}$ torr or lower) at 450° C. for an hour to completely drive hydrogen out of the film to form dangling bonds at high density within the film. A 100 nm thick $SiO_2$ film 54 was deposited further thereon by RF sputtering to obtain the structure shown in FIG. 5(A). Then, a silicon oxide mask 54A was left on the channel portion only. Phosphorus ions were introduced inside the silicon film by ion doping to form N-type conductive impurity regions 55A and 55B. The portion under the silicon oxide mask 54A remained undoped.

Figure 5B:
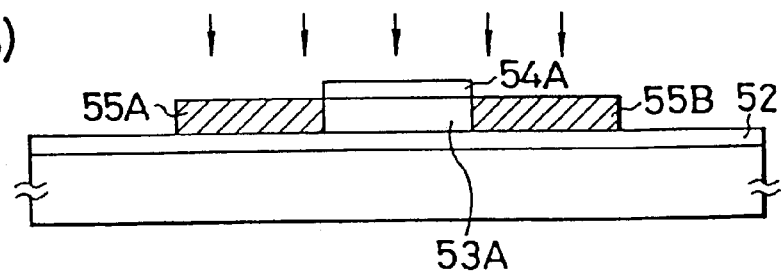

An apparatus illustrated in FIG. 3 was used to perform the laser activation of impurities according to the present invention. In the apparatus shown in FIG. 3, the sample, (as shown in FIG. 5(B)) was heated under reduced pressure of $10^{-2}$ torr or lower, and laser beam was irradiated thereto to effect laser annealing (activation). An XeF laser operated at a wavelength of 350 nsec and a pulse width of 70 nsec was used for the activation. Source and drain regions 55A and 55B are rendered N-conductive in this step because phosphorus incorporated therein is activated. At the same time, channel forming region 53A crystallizes because the silicon oxide mask 54A allows the laser beam to be transmitted.

Figure 5C:
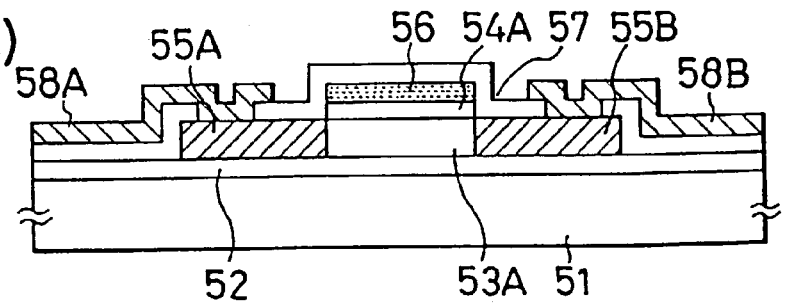

After forming the source and drain regions above, a gate contact 56 was formed on the silicon oxide mask 54A. The silicon oxide mask 54A serves as a gate dielectric as it is. An $SiO_2$ film 57 was deposited thereafter to a thickness of 100 nm, and was patterned to provide contact holes. Subsequently, aluminum was vapor deposited to form a source contact 58A and a drain contact 58B. The resulting structure was thermally annealed in hydrogen atmosphere at 350° C. to obtain a complete NTFT as shown in FIG. 5(C).

The source and drain cannot be formed in a self-aligned manner in the present example, however, laser crystallization can be effected simultaneously with annealing. Furthermore, since continuous joints can be formed for each of the source and the channel forming region, and the drain and the channel forming region, an NTFT having superior characteristics and excellent long-term reliability can be obtained.

EXAMPLE 4

Referring to FIG. 6, a process for fabricating a multilayered integrated circuit on an insulator substrate according to the present invention is described below. A 2-inch diameter disk 1.1 mm in thickness and made of Corning #7059 glass manufactured by Corning Corp. was used as a substrate 61. Other materials can be used as the substrate as well, however, they must be treated properly so that no mobile ions such as sodium may be incorporated inside the semiconductor film. An ideal substrate is a synthetic quartz substrate containing alkali ions at a very low concentration. However, if it is economically unaffordable, a commercially available low alkali glass or an alkali-free glass would be used as an alternative. In the present embodiment, a silicon oxide film 62 from 20 to 1,000 nm, e.g., 50 nm, in thickness was deposited on the substrate 61 by sputtering. The thickness of the film 62 is designed according to the degree of intrusion of the mobile ions or the influence of the mobile ions on the active layer.

The film above may be deposited not only by the sputtering process but also by other methods such as a plasma CVD. In particular, plasma CVD using TEOS (tetraethoxysilane) may be employed. The means of film deposition may be selected by taking the scale of investment and the degree of mass production into consideration.

Subsequently, an amorphous silicon film from 20 to 200 nm, e.g., 100 nm, in thickness was deposited by low pressure CVD using monosilane as the starting material. The substrate was maintained at a temperature in the range of from 520 to 560° C., e.g., at 550° C. The amorphous film thus deposited was thermally annealed at 600° C. for 24 hours. A crystalline silicon, i.e., a so-called semiamorphous silicon, was obtained as a result.

Then, the crystalline silicon film was etched into a proper pattern to form island-like semiconductor region 63. Then, a gate dielectric (silicon oxide) 64 was deposited by sputtering in an oxygen atmosphere using silicon oxide as the target to a thickness in the range of from 50 to 300 nm, e.g., 100 nm. The thickness of the gate dielectric should be determined according to the functioning conditions, etc., of the TFT.

A 500 nm thick aluminum film was deposited thereafter by sputtering, and was patterned using a mixed acid (a phosphoric acid solution containing 5% of nitric acid) to form a gate contact with connection 65. The etching rate was found to be 225 nm/minute at an etching temperature of 40° C. In this manner, a proper outer appearance for a TFT was realized. Channels each 8 μm in length and 20 μm in width were obtained.

An aluminum oxide coating was formed on the surface of the aluminum connection by anodic oxidation following the process according to the invention of the present inventors as disclosed in Japanese patent application Hei-3-231188 or in Japanese patent application Hei-3-238713. Details concerning the implementation of the process may be varied depending on the characteristics of the device desired to achieve, process conditions, investment scale, etc. In the present example, a 250 nm thick aluminum oxide film was formed.

Then, N-type source/drain regions 66 were formed by ion implantation through the gate dielectric. The impurities were incorporated at a concentration of $8 \times 10^{19}$ $cm^{-3}$. Phosphorus ions were used as the ion source, and were implanted under an accelerating voltage of 80 keV. The accelerating voltage was set by taking the thicknesses of the gate dielectric and of the semiconductor region 63 into consideration. Ion doping may be used in the place of ion implantation. Because the ions to be implanted by the ion implantation process are separated by mass analyzer within the ion implantation apparatus, an ion implantation process is advantageous in that semiconductor films free of undesirable ions can be obtained. However, an ion implantation apparatus casts limit on the size of a substrate to be processed therein. In contrast to this, an ion doping process allows processing of relatively large substrates (e.g., substrates 30 inch or more in diagonal length). However, the substrate are apt to be heated up because hydrogen ions and other unnecessary ions are accelerated at the same time.

Figure 6A:
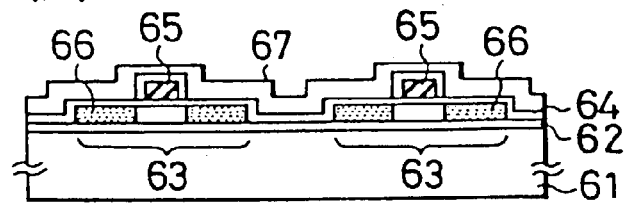
FIGS. 6(A) to 6(F) show another step-sequential process for fabricating a TFT according to the present invention.

In this manner, a TFT having an offset region was fabricated. The source/drain regions were then recrystallized by laser annealing using the gate contact portion as a mask. The laser beam used in this case was a fourth harmonic of an xenon-lamp excited Nd:YAG laser operating at a wavelength of 265 nm and a pulse width of 150 nsec. The energy was controlled to a density of 250 mJ/$cm^2$, and 10 shots were applied per point. Then, a silicon oxide film was deposited as an interlayer insulator 67 by RF plasma CVD. The resulting structure is shown in FIG. 6(A).

Furthermore, a silicon film having high mobility was obtained with high reproducibility by heating the substrate during the laser irradiation in a temperature range of from 300 to 400° C., e.g., at 350° C. For example, an average electron mobility for a silicon film of 80 $cm^2$/Vs with 80% falling within the range of from 70 to 90 $cm^2$/Vs was obtained by heating the substrate at 350° C., which is in clear contrast to that of 60 $cm^2$/Vs obtained as an average for a silicon film deposited on a substrate maintained at room temperature during the laser irradiation, with a mere 40% falling within a range of from 50 to 70 $cm^2$/Vs. Thus, a film with improved reliability can be obtained by maintaining the substrate to a proper temperature.

Figure 6B:
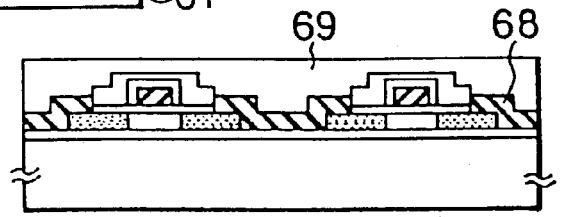

A contact hole was formed in the interlayer insulator 67 and the gate dielectric 64, and an aluminum film from 250 to 1,000 nm, e.g., 500 nm, in thickness was deposited thereon by sputtering. The thus deposited aluminum film was patterned to form a connection 68 for a first integrated circuit layer. Then, a polyimide film 69 from 0.5 to 5 μm, e.g., 3 μm, in thickness was formed by coating the structure with a starting polyimide material (e.g., Semicofine manufactured by Toray Industries, Inc) by spin coating, and condensing the material at a temperature range of from 450 to 550° C. The flatness of the resulting polyimide film was controlled to be within 0.1 μm on a 2-inch wafer. The structure thus obtained is shown in FIG. 6(B).

Figure 6C:
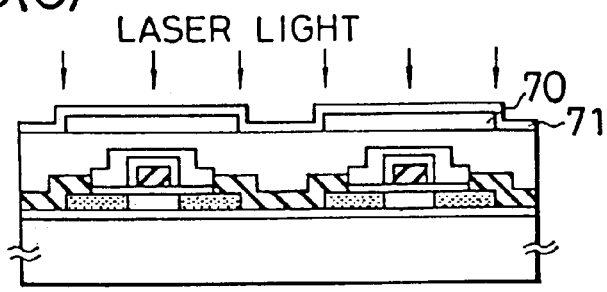

An amorphous silicon film was then deposited by plasma CVD while maintaining the substrate temperature in the range of from 300 to 400° C., e.g., at 320° C. The resulting amorphous silicon film was patterned into island-like portions and a silicon oxide film 71 was deposited thereon under the same conditions as those used in forming the oxide film 64. A laser light was irradiated to the resulting structure to crystallize the island-like semiconductor region 70. The resulting structure is shown in FIG. 6(C).

In the present example, the 2-inch wafer was divided into 32 portions as shown in FIG. 2 in irradiating a laser light for the activation of the source/drain regions 66 and for the crystallization of the semiconductor region 70. A laser light having an approximately square-shaped cross section was irradiated sequentially on each of the areas (the shaded portion shown in the figure) by following the numbers attached to each of the areas. Laser annealing may seem to be inferior to thermal annealing in productivity. However, considering that the YAG laser used in the present example was operated at a repetition frequency of 200 Hz with a time duration of reside on a single point of 0.1 sec, it follows that a single wafer is processed by laser processing within a time period of less than 10 seconds with the time for wafer transfer included. If automatic transfer of the wafer were to be employed in the process, 200 or more wafers can be processed in one hour.

It is still possible to shorten the process time by reducing exchange times of the wafers, i.e., by enlarging the area of the wafer or by increasing the output power of the laser. Further shorter process can be realized by increasing the cross section area of the laser beam.

Figure 6D:
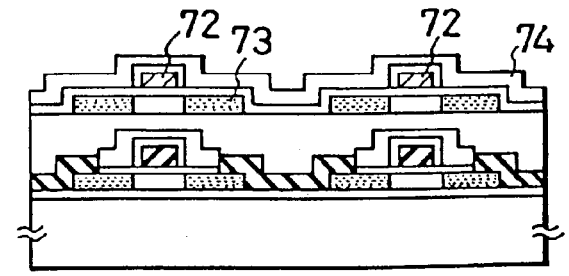

Then, in the same manner as in the process for the first integrated circuit layer, a gate contact with connection 72 was formed using aluminum coated with an anodic oxidation film, and was bombarded with boron ions and annealed to form source/drain regions 73. This was followed by the deposition of a silicon oxide film 74 as an interlayer insulator by sputtering. The resulting structure is shown in FIG. 6(D).

Figure 6E:
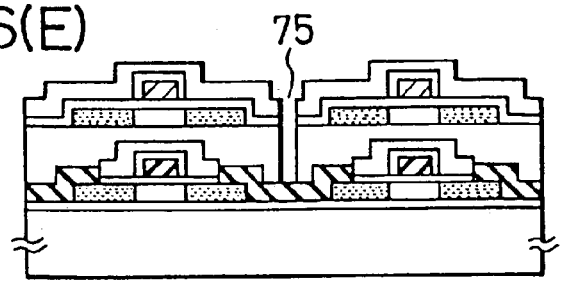

Then, a contact hole 75 penetrating the interlayer insulator (silicon oxide) 74, the gate dielectric (silicon oxide) 71, and the interlayer insulator (polyimide) 69 was formed to yield a structure shown in FIG. 6(E). The diameter of the contact hole was 6 μm, i.e., twice the thickness of the polyimide interlayer insulator. Then, aluminum coating was deposited thereon by sputtering at a thickness of from 250 to 3,000 nm, e.g., 1,500 nm, to completely bury the contact hole. The aluminum coating was etched for a depth of 1,000 nm by anisotropic etching, and was patterned to form a connection 76. Care must be taken in conducting this step, since too thin an aluminum coating causes disconnection to form at the contact hole.

Figure 6F:
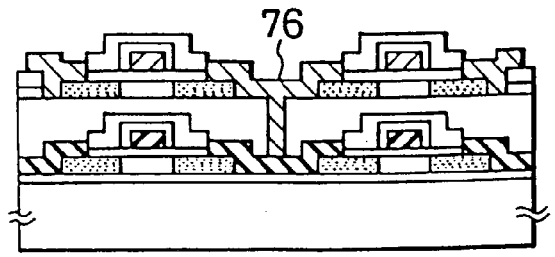

Thus, a two-layered integrated circuit as shown in FIG. 6(F) was obtained. The above operation may be repeated to form an integrated circuit with more layers.

EXAMPLE 5

Referring to FIG. 7, a process for fabricating a CMOS circuit according to the present invention is described. First, a base oxide film 81 was deposited at a thickness of from 20 to 200 nm on a quartz substrate 80 by sputtering. Then, an amorphous silicon film 82 was deposited further thereon at a thickness of from 150 to 250 nm by plasma CVD or by low pressure CVD using monosilane or disilane as the starting material. The concentration of oxygen or nitrogen in the amorphous silicon film should be $10^{18}$ cm$^{-2}$ or lower, and preferably, $10^{17}$ cm$^{-2}$ or lower. A low pressure CVD is best suited to achieve this. The oxygen concentration was controlled to $10^{17}$ cm$^{-2}$ or lower in the present example.

Figure 7A:
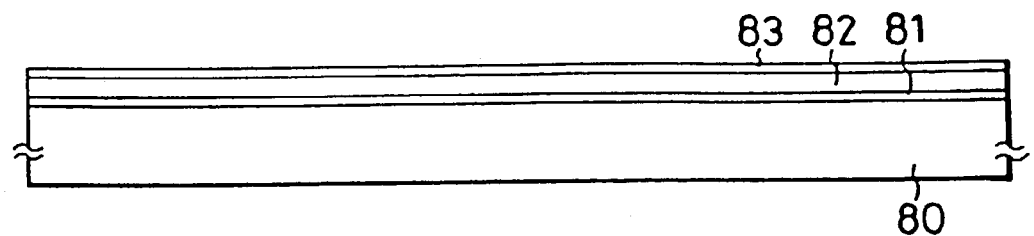
FIGS. 7(A) to 7(D) show another step-sequential process for fabricating a TFT according to the present invention.

Then, a 50 to 150 nm thick silicon oxide film was provided as a protective film 83, and annealed under an argon or nitrogen atmosphere at 600° C. for a duration of from 4 to 100 hours to allow the film to crystallize. The resulting structure is shown in FIG. 7(A).

Figure 7B:
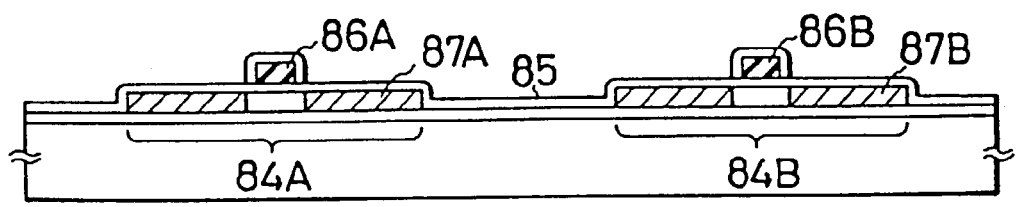
Figure 7C:
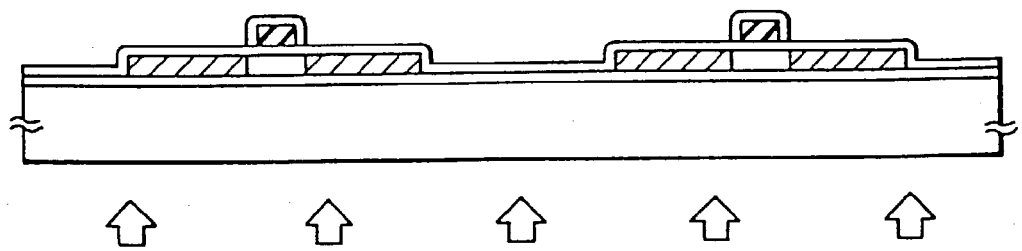
Figure 7D:
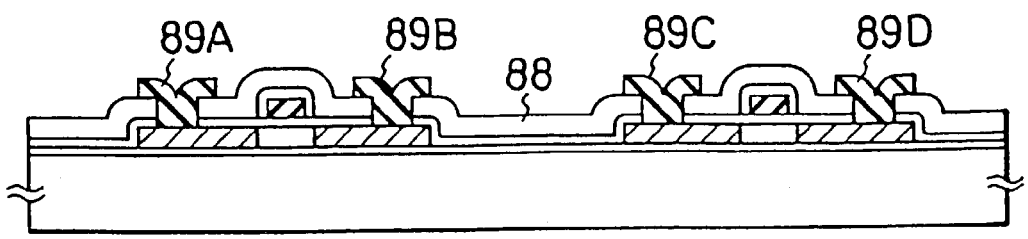

The silicon film thus obtained was patterned into island-like portions to provide a PMOS region 84A and an NMOS region 84B as shown in FIG. 7(B). Then, a silicon oxide film from 50 to 150 nm in thickness was deposited over the island-like portion by sputtering to provide a gate dielectric 85. Then, an aluminum film from 200 nm to 5 μm in thickness was formed by sputtering, patterned, and electrolyzed in an electrolytic solution to form an anodic oxidation coating on the upper surface and the sides of the film. Thus was obtained each of the island-like gate contact portions 86A and 86B.

Subsequently, impurities were introduced into each of the island-like silicon films of the TFTs by ion doping in a self-aligned manner, using the gate contact portions as the mask. This step was performed by first implanting phosphorus into the entire area using phosphine (PH$_3$) as the doping gas, and boron was then implanted into the island-like region using diborane (B$_2$H$_6$) as the doping gas while covering the island-like region 84B alone with a photoresist. Phosphorus was incorporated at a dose of from $2 \times 10^{15}$ to $8 \times 10^{15}$ cm$^{-2}$, and boron was introduced at a dose of from $4 \times 10^{15}$ to $10 \times 10^{15}$ cm$^{-2}$, provided that the boron dose may be exceed the dose of phosphorus.

Since the doping step damages the crystallinity of the resulting silicon film, the laser annealing process according to the present invention was applied to the silicon film for activation. The activation process was performed using the apparatus shown in FIG. 3. Referring to FIG. 3, a sample (the shape thereof is illustrated in FIG. 5(B)) was heated under an atmosphere of 10$^{-2}$ torr and a laser beam was irradiated to the sample to effect laser annealing (activation). An XeF laser operated at an wavelength of 350 nm and a pulse width of 70 nsec was used for the activation. In general, the laser beam is irradiated to the upper surface of the sample, but in the present example, the laser beam was irradiated from the back side of the sample. When the laser beam is irradiated to the back side of the sample as in the present case, a substrate material capable of transmitting the laser beam must be used. The source/drain regions 87A and 87B shown in the figure are activated by the laser irradiation in this step, and the channel forming region is also subjected to laser irradiation at the same time. Accordingly, the present process contributes to the achievement of a continuous crystallinity at the boundary between the channel forming region and the source/drain regions and thereby improves the reliability of the resulting device.

Thus, a P-type region 87A and an N-type region 87B were formed by the above steps. The sheet resistance of these regions were found to be in the range of from 200 to 800 $\Omega/cm^2$. A silicon oxide film was formed thereafter as an interlayer insulator 88 at a thickness of from 300 to 1,000 nm by sputtering. The silicon oxide film may be formed by plasma CVD. In particular, a silicon oxide film having a favorable step coverage can be realized by employing a plasma CVD using TEOS.

Contact holes were provided in the source/drain (impurity regions) of the TFT, and aluminum connection 89A to 89D were provided therein. Finally, the resulting structure was annealed in hydrogen for a duration of 2 hours to reduce the number of dangling bonds within the silicon film. Thus was obtained a TFT having typically a mobility of 60 $cm^2/Vs$ for both PMOS and NMOS.

EXAMPLE 6

Figure 9:
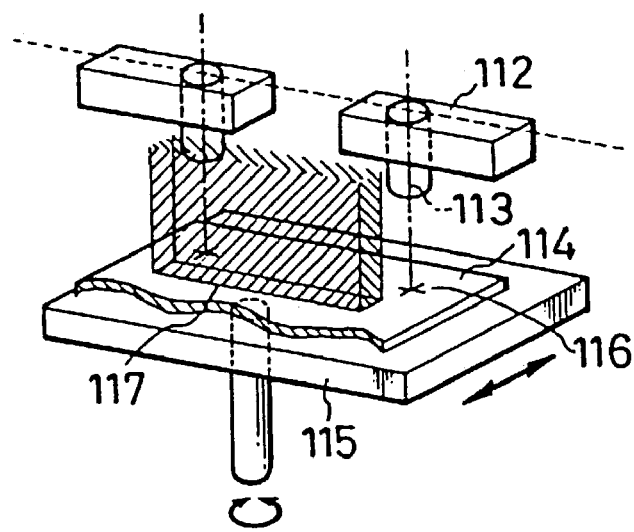
FIG. 9 shows schematically an alignment device for use in a laser processing apparatus according to the present invention.

Referring to FIG. 9, an apparatus for use in the alignment processes of the present example according to the present invention is described below. A sample (substrate) 114 is mounted on a stage 115 capable of making a translational movement at least along one direction and a rotational movement. The sample has thereon at least two alignment markers provided by a means such as printing. The sample alignment is performed by adjusting those alignment markers using at least two monitoring cameras 113. The monitoring cameras 113 each has an arm 112 so that the entire camera body may be moved along the arm. In this manner, the sample can be set and reset without being disturbed by the cameras. A laser beam having a rectangular cross section 117 is irradiated approximately in parallel with the alignment marker.

Figure 10:
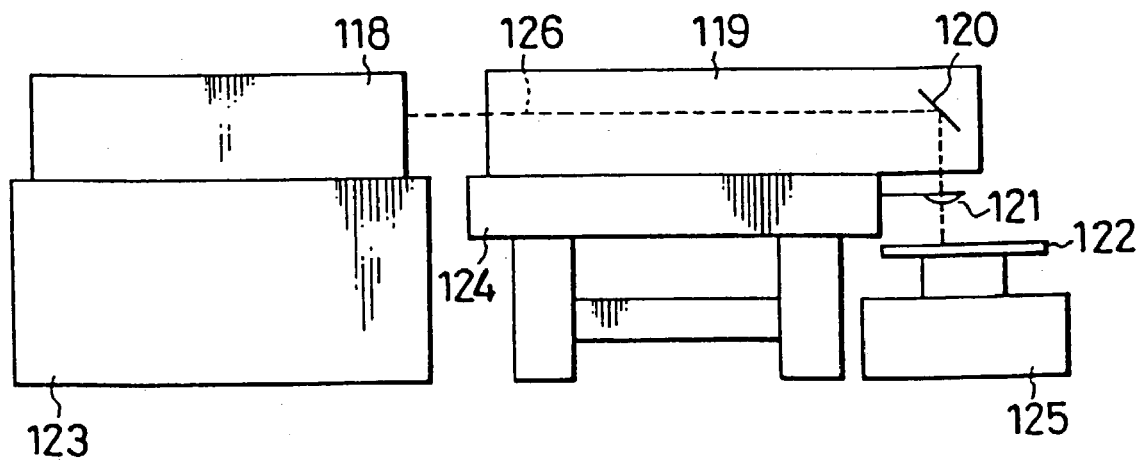
FIG. 10 shows schematically a laser processing apparatus described in the Example according to the present invention.

FIG. 10 shows schematically the laser processing apparatus used in the examples according to the present invention. The laser processing apparatus comprises a laser generation device 118 and an optical system 119 each being installed on a vibration isolation table 123 and an optical frame 124, respectively. The stage 122 is fixed on a separate vibration isolation table 125. The stage 122 can be moved along the Y- and θ-axes, each driven by a DC servomotor and a pulse motor, respectively. The laser beam 126 emitted from the laser generation device is irradiated to the sample mounted on a stage via a mirror 120 and a cylindrical lens provided on the optical frame 124. It can be seen that the devices are each installed on a vibration isolation device independently to each other to be isolated from any external vibration. Moreover, the vibration which generates with the movement of the stage has no influence on the laser output. As a comparative example, an attempt was made by setting all the devices on a single vibration isolation table. It was found that a vibration attributed to the movement of the stage was transferred to the laser generating device to fluctuate the laser output. The laser apparatus was out of service for about two seconds waiting for the vibration to cease completely. It can be seen that this results in a poor productivity.

Figure 11:
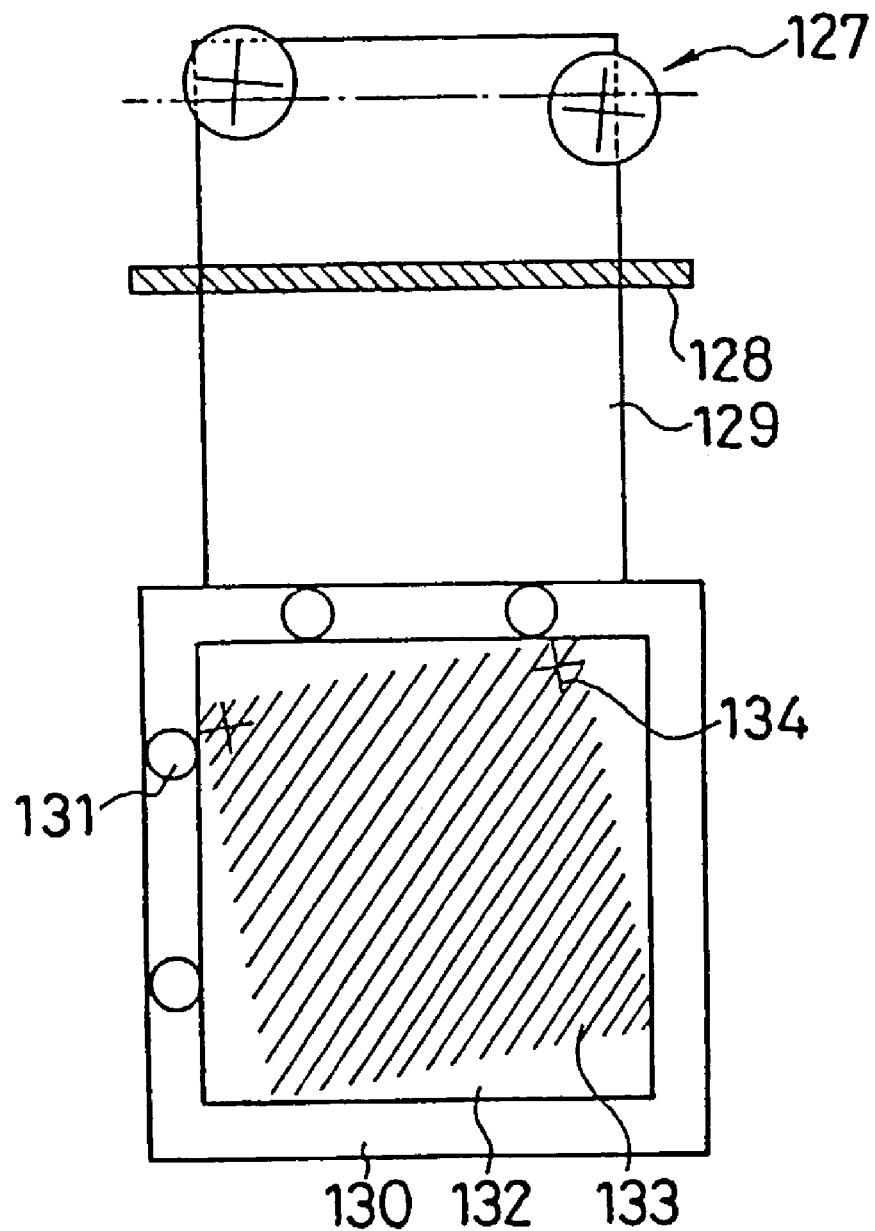
FIG. 11 shows an article used in the alignment step of a laser processing apparatus according to the present invention.

FIG. 11 shows an article for use in sample alignment. A printed pattern 133 can be seen on a sample (substrate) 132. The pattern is sometimes printed displaced from the substrate. Moreover, though the sample 132 is fixed on the substrate holder 130 using a pin 131, its position is sometimes found to be incorrect (the sample is not placed in parallel with the marker). Accordingly, the pattern 133 is often found to be not in parallel with the laser irradiation plane 128 due to such reasons enumerated above. Thus, correction must be made by position matching of the alignment marker 134 on the sample though a monitoring camera 127 to place the pattern on the sample in parallel with the laser irradiation plane. It should be noted, however, that there may be cases in which the line connecting the two monitoring cameras is not in parallel with the laser irradiation plane. In such a case, however, the correction can be easily made because the angle between the laser irradiation plane and each of the moving directions of the monitoring cameras, the substrate holder, and the stage 129 is known.

FIG. 12 shows the alignment process. As shown in FIG. 12(A), a sample is moved along the stage 129 to place the alignment marker just under the monitoring camera.

Figure 12A:
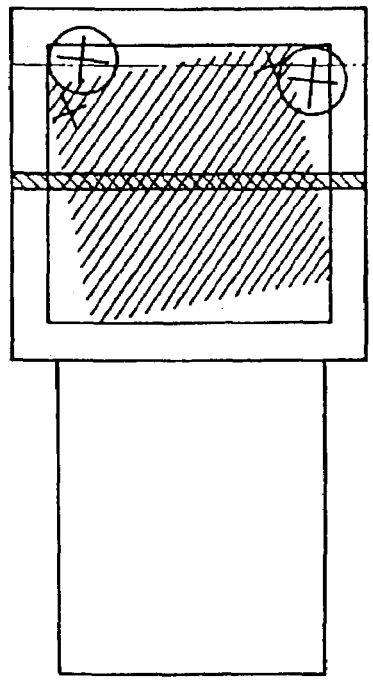
FIGS. 12(A) to 12(D) show alignment steps described in the Example according to the present invention.
Figure 12B:
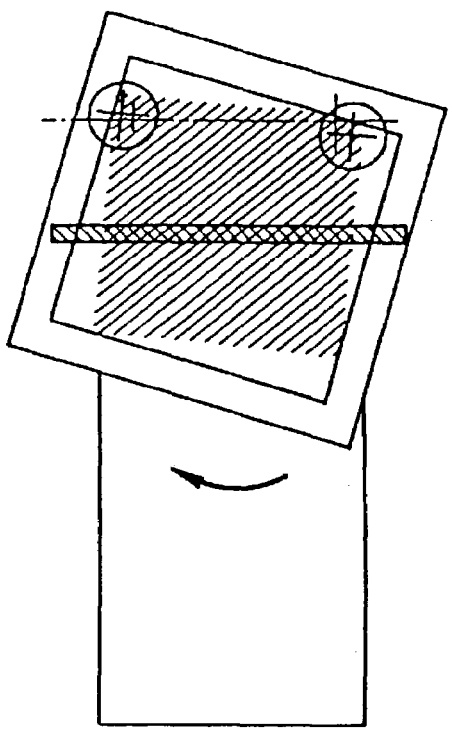

Then, as shown in FIG. 12(B), the stage is translated and rotated to bring the alignment marker in parallel with the marker of the monitoring camera. The stage in the present example is not allowed to move transversely, but an apparatus capable of moving the stage not only along the vertical direction of the figure but also transversely can further improve the alignment precision.

Figure 12C:
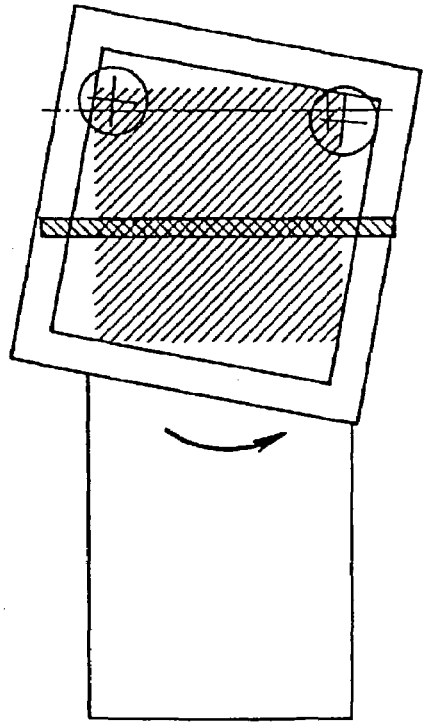

Upon completion of the alignment, the stage is rotated for a predetermined angle as shown in FIG. 12(C). The rotation angle includes information concerning the angles between the laser irradiation plane and each of the movement directions of the stage and the monitoring camera. The rotation angle may be stored previously in the memory device of the drive control unit, and automatically corrected upon completion of the alignment. Thus, the pattern can be found in parallel with the laser irradiation plane after performing the steps above.

Figure 12D:
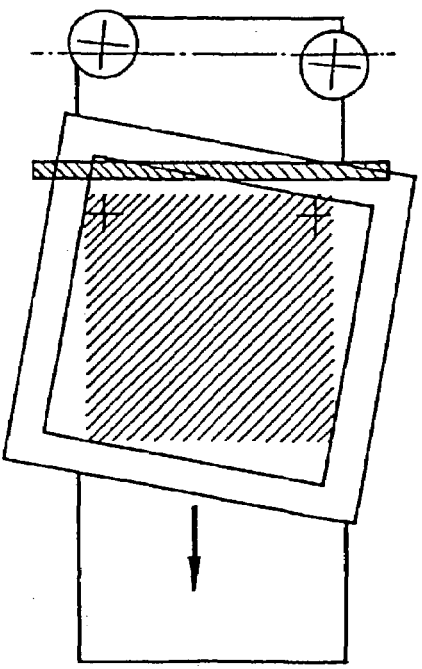

Then, the sample is moved to the position for initiating laser irradiation as shown in FIG. 12(D). A distance according to the previously set value may be used, or an arbitrarily set value may be used instead. The alignment process can be completed in this manner.

As described in the foregoing, the present invention provides a highly reliable semiconductor device by realizing an optimal laser annealing and thereby providing a highly reliable semiconductor film with less fluctuation in properties.

Furthermore, the present invention provides laser processing process improved in productivity. The present invention is particularly effective for a laser processing apparatus which emits laser beam having a stripe-shaped cross section. The process according to the present invention realized an accurate processing with high productivity in laser scribing, laser annealing, laser doping, and other laser processing apparatuses of various types. Accordingly, the present invention is industrially significant.

While the invention has been described in detail and with reference to specific embodiments thereof, it will be apparent to one skilled in the art that various changes and modifications can be made therein without departing from the spirit and scope thereof.

What is claimed is:

1. A method of manufacturing a semiconductor device comprising:
    forming a semiconductor layer over a glass substrate;
    patterning the semiconductor layer; and
    irradiating the semiconductor layer with a harmonic of a laser beam while moving an irradiated region of the semiconductor layer in one direction with respect to the laser beam, wherein 80 to 98% of the irradiated region overlaps with a neighboring irradiated region of the semiconductor layer, and wherein the harmonic of the laser beam is a pulse laser beam.

2. A method according to claim 1, wherein the laser beam is selected from the group consisting of excimer laser beam and YAG laser beam.

3. A method according to claim 1, wherein a number of pulses irradiated on one irradiated region is 5 to 50.

4. A method according to claim 1, wherein the semiconductor layer has a thickness of 2 μm or less.

5. A method according to claim 1, wherein a wavelength of the laser beam is 400 nm or less.

6. A method according to claim 1, wherein the step of patterning is performed before the laser irradiation.

7. A method according to claim 1, wherein the harmonic of the laser beam is a fourth harmonic.

8. A method of manufacturing a semiconductor device comprising:

forming a semiconductor layer over a glass substrate;

patterning the semiconductor layer; and irradiating the semiconductor layer with a harmonic of a laser beam which has a rectangular shape having a width and a length while moving an irradiated region of the semiconductor layer in a direction of the width, the width being smaller than the length, wherein 80 to 98% of the irradiated region overlaps with a neighboring irradiated region of the semiconductor layer, and wherein the harmonic of the laser beam is a pulse laser beam.

9. A method according to claim 8, wherein the laser beam is selected from the group consisting of excimer laser beam and YAG laser beam.

10. A method according to claim 8, wherein a number of pulses irradiated on one irradiated region is 5 to 50.

11. A method according to claim 8, wherein the semiconductor layer comprises amorphous silicon.

12. A method according to claim 8, wherein a wavelength of the laser beam is 400 nm or less.

13. A method according to claim 8, wherein the step of patterning is performed before the laser irradiation.

14. A method according to claim 8, wherein the harmonic of the laser beam is a fourth harmonic.

15. A method of manufacturing a semiconductor device comprising:

forming a semiconductor layer over a glass substrate;

patterning the semiconductor layer; and irradiating the semiconductor layer with a harmonic of a pulse laser beam having a cross section having a width and a length while moving the substrate in a direction of the width per pulse by a distance smaller than the width, wherein 80 to 98% of one irradiated region of the semiconductor layer overlaps with a neighboring irradiated region of the semiconductor layer.

16. A method according to claim 15, wherein the laser beam is selected from the group consisting of excimer laser beam and YAG laser beam.

17. A method according to claim 15, wherein a number of pulses irradiated on one irradiated region is 5 to 50.

18. A method according to claim 15, wherein the semiconductor layer comprises amorphous silicon.

19. A method according to claim 15, wherein a wavelength of the laser beam is 400 nm or less.

20. A method according to claim 15, wherein the step of patterning is performed before the laser irradiation.

21. A method according to claim 15, wherein the harmonic of the pulse laser beam is a fourth harmonic.

22. A method of manufacturing a semiconductor device comprising:

forming a semiconductor layer over a glass substrate;

patterning the semiconductor layer; and irradiating the semiconductor layer with a harmonic of a pulse laser beam which has a rectangular shape having a width and a length and elongated in a direction of the length while moving the substrate in a direction of the width per pulse by a distance smaller than the width, wherein 80 to 98% of one irradiated region of the semiconductor layer overlaps with a neighboring irradiated region of the semiconductor layer.

23. A method according to claim 22, wherein the laser beam is selected from the group consisting of excimer laser beam and YAG laser beam.

24. A method according to claim 22, wherein a number of pulses irradiated on one irradiated region is 5 to 50.

25. A method according to claim 22, wherein the semiconductor layer comprises amorphous silicon.

26. A method according to claim 22, wherein a wavelength of the laser beam is 400 nm or less.

27. A method according to claim 22, wherein the step of patterning is performed before the laser irradiation.

28. A method according to claim 22, wherein the harmonic of the laser beam is a fourth harmonic.

29. A method of manufacturing a semiconductor device comprising:

forming a semiconductor layer over a glass substrate;

patterning the semiconductor layer; and irradiating the semiconductor layer with a harmonic of a YAG laser beam having a cross section having a width and a length while moving an irradiated region of the semiconductor layer in a direction of the width, wherein 80 to 98% of the irradiated region overlaps with a neighboring irradiated region of the semiconductor layer, and wherein the YAG laser beam is a pulse laser beam.

30. A method according to claim 29, wherein a number of pulses irradiated on one irradiated region is 5 to 50.

31. A method according to claim 29, wherein the semiconductor layer comprises amorphous silicon.

32. A method according to claim 29, wherein a wavelength of the laser beam is 400 nm or less.

33. A method according to claim 29, wherein the YAG laser beam is an Nd:YAG laser.

34. A method according to claim 29, wherein the step of patterning is performed before the laser irradiation.

35. A method according to claim 29, wherein the YAG laser beam is a fourth harmonic.

36. A method of manufacturing a semiconductor device comprising the steps of:

forming a semiconductor layer over a glass substrate;

patterning the semiconductor layer; and irradiating the semiconductor layer with a harmonic of a rectangular YAG laser beam having a width and a length and elongated in a direction of the length while moving an irradiated region of the semiconductor layer in a direction of the width, wherein 80 to 98% of the irradiated region overlaps with a neighboring irradiated region of the semiconductor layer, and wherein the YAG laser beam is a pulse laser beam.

37. A method according to claim 36, wherein a number of pulses irradiated on one irradiated region is 5 to 50.

38. A method according to claim 36, wherein the semiconductor layer comprises amorphous silicon.

39. A method according to claim 36, wherein a wavelength of the laser beam is 400 nm or less.

40. A method according to claim 36, wherein the YAG laser beam is an Nd:YAG laser.

41. A method according to claim 36, wherein the step of patterning is performed before the laser irradiation.

42. A method according to claim 36, wherein the rectangular YAG laser beam is a fourth harmonic.

43. A method of manufacturing a semiconductor device comprising:
   forming a semiconductor layer over a glass substrate;
   patterning the semiconductor layer; and
   irradiating the semiconductor layer with a harmonic of a laser beam while moving an irradiated region of the semiconductor layer in one direction with respect to the laser beam,
   wherein the harmonic of the laser beam is a pulse laser beam, and
   wherein the number of pulses irradiated on one irradiated region is 5 to 50.

44. A method according to claim 43, wherein the laser beam is selected from the group consisting of excimer laser beam and YAG laser beam.

45. A method according to claim 43, wherein the semiconductor layer has a thickness of 2 μm or less.

46. A method according to claim 43, wherein a wavelength of the laser beam is 400 nm or less.

47. A method according to claim 43, wherein the step of patterning is performed before the laser irradiation.

48. A method according to claim 43, wherein the harmonic of the laser beam is a fourth harmonic.

49. A method of manufacturing a semiconductor device comprising:
   forming a semiconductor layer over a glass substrate;
   patterning the semiconductor layer; and
   irradiating the semiconductor layer with a harmonic of a laser beam which has a rectangular shape having a width and a length while moving an irradiated region of the semiconductor layer in a direction of the width, the width being smaller than the length,
   wherein the harmonic of the laser beam is a pulse laser beam, and
   wherein the number of pulses irradiated on one irradiated region is 5 to 50.

50. A method according to claim 49, wherein the laser beam is selected from the group consisting of excimer laser beam and YAG laser beam.

51. A method according to claim 49, wherein the semiconductor layer comprises amorphous silicon.

52. A method according to claim 49, wherein a wavelength of the laser beam is 400 nm or less.

53. A method according to claim 49, wherein the step of patterning is performed before the laser irradiation.

54. A method according to claim 49, wherein the harmonic of the laser beam is a fourth harmonic.

55. A method of manufacturing a semiconductor device comprising:
   forming a semiconductor layer over a glass substrate;
   patterning the semiconductor layer; and
   irradiating the semiconductor layer with a harmonic of a pulse laser beam having a cross section having a width and a length while moving the substrate in a direction of the width per pulse by a distance smaller than the width,
   wherein the number of pulses irradiated on one irradiated region is 5 to 50.

56. A method according to claim 55, wherein the laser beam is selected from the group consisting of excimer laser beam and YAG laser beam.

57. A method according to claim 55, wherein the semiconductor layer comprises amorphous silicon.

58. A method according to claim 55, wherein a wavelength of the laser beam is 400 nm or less.

59. A method according to claim 55, wherein the step of patterning is performed before the laser irradiation.

60. A method according to claim 55, wherein the harmonic of the pulse laser beam is a fourth harmonic.

61. A method of manufacturing a semiconductor device comprising:
   forming a semiconductor layer over a glass substrate;
   patterning the semiconductor layer; and
   irradiating the semiconductor layer with a harmonic of a pulse laser beam which has a rectangular shape having a width and a length and elongated in a direction of the length while moving the substrate in a direction of the width per pulse by a distance smaller than the width,
   wherein the number of pulses irradiated on one irradiated region is 5 to 50.

62. A method according to claim 61, wherein the laser beam is selected from the group consisting of excimer laser beam and YAG laser beam.

63. A method according to claim 61, wherein the semiconductor layer comprises amorphous silicon.

64. A method according to claim 61, wherein a wavelength of the laser beam is 400 nm or less.

65. A method according to claim 61, wherein the step of patterning is performed before the laser irradiation.

66. A method according to claim 61, wherein the harmonic of the laser beam is a fourth harmonic.

67. A method of manufacturing a semiconductor device comprising:
   forming a semiconductor layer over a glass substrate;
   patterning the semiconductor layer; and
   irradiating the semiconductor layer with a harmonic of a YAG laser beam having a cross section having a width and a length while moving an irradiated region of the semiconductor layer in a direction of the width,
   wherein the YAG laser beam is a pulse laser beam, and
   wherein the number of pulses irradiated on one irradiated region is 5 to 50.

68. A method according to claim 67, wherein the semiconductor layer comprises amorphous silicon.

69. A method according to claim 67, wherein a wavelength of the laser beam is 400 nm or less.

70. A method according to claim 67, wherein the YAG laser beam is an Nd:YAG laser.

71. A method according to claim 67, wherein the step of patterning is performed before the laser irradiation.

72. A method according to claim 67, wherein the YAG laser beam is a fourth harmonic.

73. A method of manufacturing a semiconductor device comprising the steps of:
   forming a semiconductor layer over a glass substrate;
   patterning the semiconductor layer; and
   irradiating the semiconductor layer with a harmonic of a rectangular YAG laser beam having a width and a length and elongated in a direction of the length while moving an irradiated region of the semiconductor layer in a direction of the width, wherein the YAG laser beam is a pulse laser beam, and wherein the number of pulses irradiated on one irradiated region is 5 to 50.

74. A method according to claim 73, wherein the semiconductor layer comprises amorphous silicon.

75. A method according to claim 73, wherein a wavelength of the laser beam is 400 nm or less.

76. A method according to claim 73, wherein the YAG laser beam is an Nd:YAG laser.

77. A method according to claim 73, wherein the step of patterning is performed before the laser irradiation.

78. A method according to claim 73, wherein the rectangular YAG laser beam is a fourth harmonic.

* * * * *